(12) United States Patent
Jibu et al.

(10) Patent No.: US 8,410,865 B2
(45) Date of Patent: Apr. 2, 2013

(54) SURFACE ACOUSTIC WAVE FILTER AND DUPLEXER USING THE SAME

(75) Inventors: Toru Jibu, Osaka (JP); Shoji Okamoto, Osaka (JP); Yosuke Hamaoka, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 401 days.

(21) Appl. No.: 12/827,091

(22) Filed: Jun. 30, 2010

(65) Prior Publication Data

US 2011/0001578 A1    Jan. 6, 2011

(30) Foreign Application Priority Data

Jul. 3, 2009    (JP) .................................. 2009-158723

(51) Int. Cl.
*H03H 9/15* (2006.01)
*H01L 41/04* (2006.01)

(52) U.S. Cl. ........................................ 333/133; 333/193
(58) Field of Classification Search .................. 333/133, 333/193, 194, 195, 196
See application file for complete search history.

(56) References Cited

U.S. PATENT DOCUMENTS

| | | | |
|---|---|---|---|
| 6,955,787 B1 * | 10/2005 | Hanson | 422/50 |
| 7,141,210 B2 * | 11/2006 | Bell et al. | 422/51 |
| 7,473,981 B2 * | 1/2009 | Matsumoto et al. | 257/532 |
| 7,683,736 B2 * | 3/2010 | Inoue et al. | 333/133 |
| 2012/0174678 A1 * | 7/2012 | Gallagher et al. | 73/658 |

FOREIGN PATENT DOCUMENTS

| | | |
|---|---|---|
| JP | 06-252677 | 9/1994 |
| JP | 06-252686 | 9/1994 |
| JP | 06-291601 | 10/1994 |
| JP | 07-212175 | 8/1995 |

* cited by examiner

*Primary Examiner* — Dean O Takaoka
(74) *Attorney, Agent, or Firm* — Wenderoth, Lind & Ponack, L.L.P.

(57) ABSTRACT

A SAW filter includes a piezoelectric body, an IDT electrode on the piezoelectric body, and signal wiring electrically connected to the IDT electrode. The signal wiring has a thickness not less than a skin depth specified based on the frequency of a signal passing through the signal wiring and the electrical conductivity of the signal wiring. As a result, the signal wiring has low propagation loss of the signal passing through it, so that the SAW filter has excellent transmission characteristics.

6 Claims, 9 Drawing Sheets

SURFACE ACOUSTIC WAVE FILTER AND DUPLEXER USING THE SAME

BACKGROUND OF THE INVENTION

1. Field of the Invention

The present invention relates to surface acoustic wave filters (hereinafter, SAW filters) and duplexers using the SAW filters.

2. Background Art

In conventional SAW filters, signal wiring is made thicker than IDT electrodes. The thickness of the signal wiring, however, has not been explicitly specified because at some thickness, there is an increase in the propagation loss of signals passing through the signal wiring. For example, Japanese Patent Unexamined Publication No. H7-212175 has disclosed a specific thickness of the signal wiring, but the thickness cannot minimize the propagation loss of signals passing through the signal wiring.

SUMMARY OF THE INVENTION

The SAW filter of the present invention includes a piezoelectric body, an IDT electrode formed thereon, and signal wiring electrically connected to the IDT electrode. The signal wiring has a thickness not less than a skin depth "d" (μm) calculated by Formula 1:

$$d = \sqrt{\frac{2.0 \times 10^{-4}}{f \times \sigma}} \qquad \text{Formula 1}$$

where "f" represents the frequency (GHz) of a signal passing through the signal wiring, and "σ" represents the electrical conductivity (S/m) of the signal wiring.

With this structure, the signal wiring has low propagation loss of signals passing through it, so that the SAW filter has excellent transmission characteristics.

DETAILED DESCRIPTION OF THE INVENTION

Embodiments of the present invention will be described as follows with reference to the accompanied drawings. Note that the present invention is not limited to these embodiments.

First Embodiment

Figure 1A:
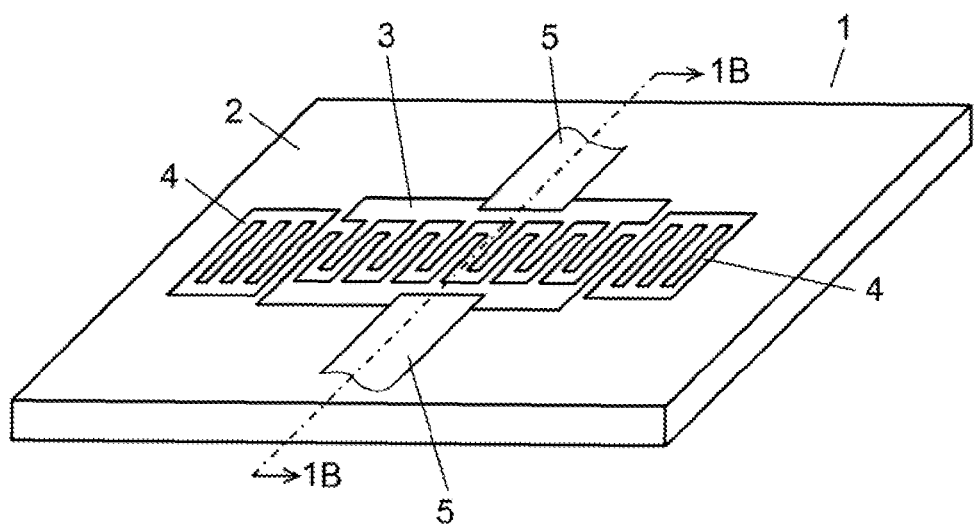
FIG. 1A is a perspective view of a SAW filter according to a first embodiment of the present invention.
Figure 1B:
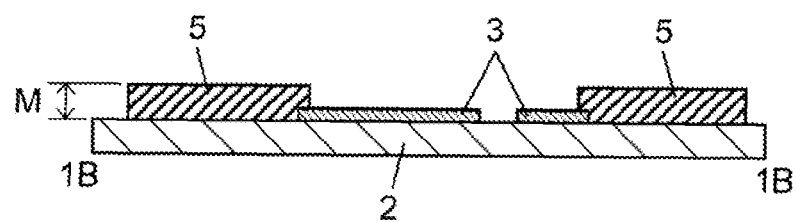
FIG. 1B is a sectional view taken along a line 1B-1B of FIG. 1A.

The following is a description, with reference to FIGS. 1A and 1B, of SAW filter 1 according to the present embodiment. FIG. 1A is a perspective view of SAW filter 1, which includes piezoelectric body 2 and IDT (interdigital transducer) electrode 3 formed thereon. SAW filter 1 further includes a pair of reflectors 4 and signal wiring 5. Reflectors 4 sandwich IDT electrode 3 in the direction of acoustic wave propagation, and signal wiring 5 is electrically connected to IDT electrode 3. More specifically, signal wiring 5 is electrically connected at one end to IDT electrode 3, and at the other end to an electrode pad (not shown), another IDT electrode (not shown), or other similar device.

FIG. 1B is a sectional view taken along a line 1B-1B of FIG. 1A. As shown in FIG. 1B, signal wiring 5 has a thickness M. IDT electrode 3 and signal wiring 5 are electrically connected to each other by overlapping their outer edges in FIG. 1B. Alternatively, they may be electrically connected to each other by extending the outer edge of IDT electrode 3 until it reaches most of the region between piezoelectric body 2 and signal wiring 5. In the latter case, signal wiring 5 forms a signal propagation path together with IDT electrode 3 formed between piezoelectric body 2 and signal wiring 5. As a result, the total thickness of IDT electrode 3 and signal wiring 5 becomes the thickness M. The electrical connection between IDT electrode 3 and signal wiring 5 can alternatively be achieved by joining their end faces, instead of overlapping their outer edges.

Signal wiring 5 is made of a conductive material such as Al, Ni, or Au. It is possible to add Cu, Mg, Ti, Ta, or the like to the conductive material. It is also possible to interpose an adhesive layer of Ti between piezoelectric body 2 and signal wiring 5.

Figure 2:
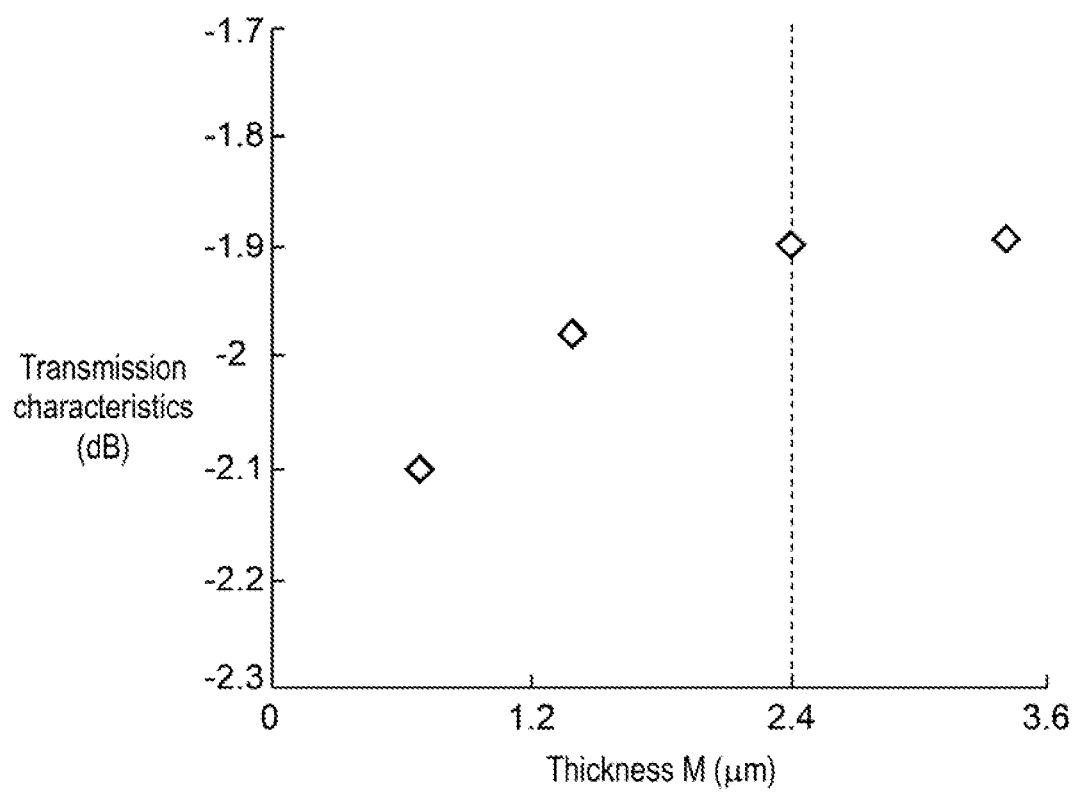
FIG. 2 shows transmission characterisitics of the SAW filter according to the first embodiment at 880 MHz.

FIG. 2 shows transmission characteristics of SAW filter 1 at 880 MHz. In this case, signal wiring 5 is made of Al and has the thickness M. The signal passing through signal wiring 5 has a frequency of 880 MHz, which is in the transmit frequency range of Universal Mobile Telecommunications System (hereinafter, UMTS) Band VIII. As known from FIG. 2, the transmission characteristics increase at a decreasing rate with increasing thickness M of signal wiring 5, but level off at about −1.9 dB when the thickness M reaches about 2.4 μm.

Figure 3A:
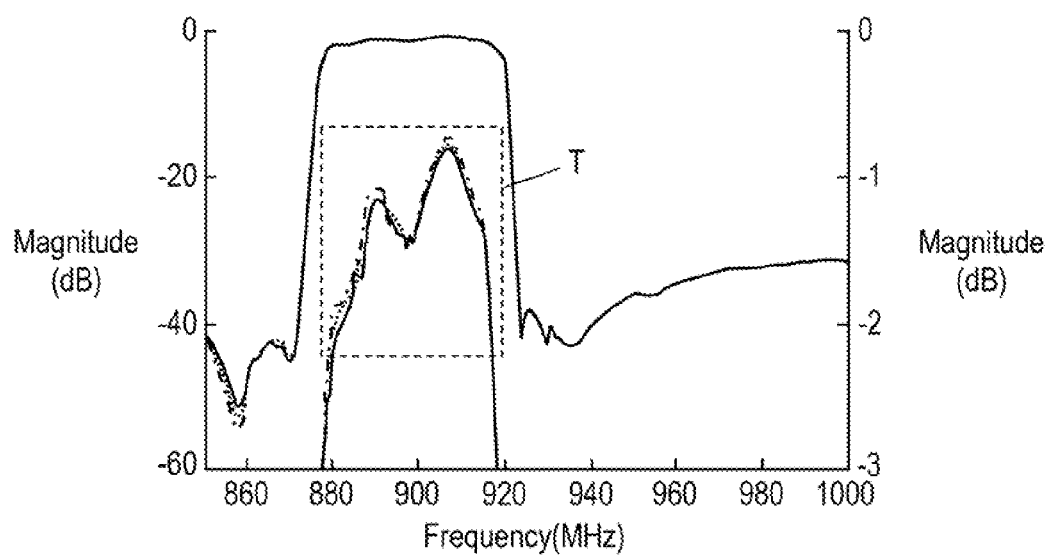
FIG. 3A shows transmission characteristics of a band-pass filter using the SAW filter according to the first embodiment.
Figure 3B:
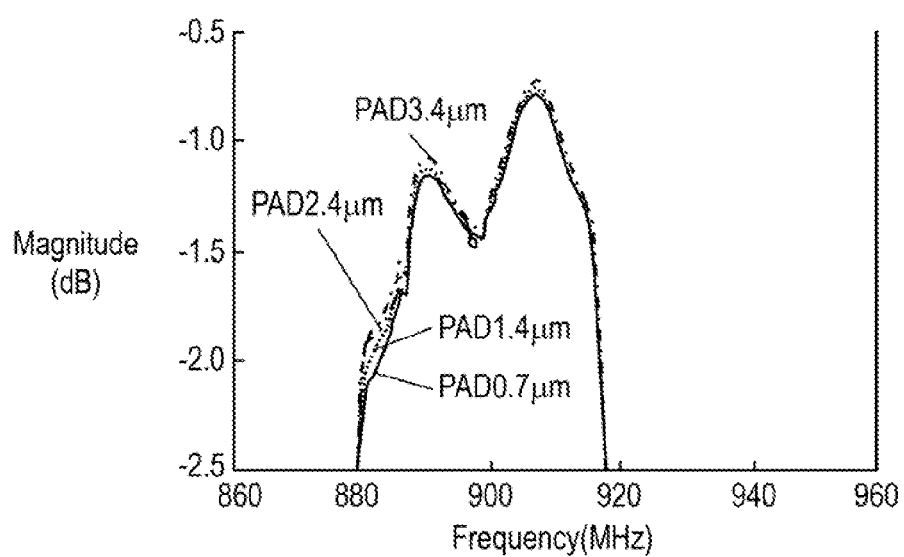
FIG. 3B is an enlarged view of an area "T" enclosed by a dotted line shown in FIG. 3A, the area "T" including the point of 880 MHz.
Figure 6:
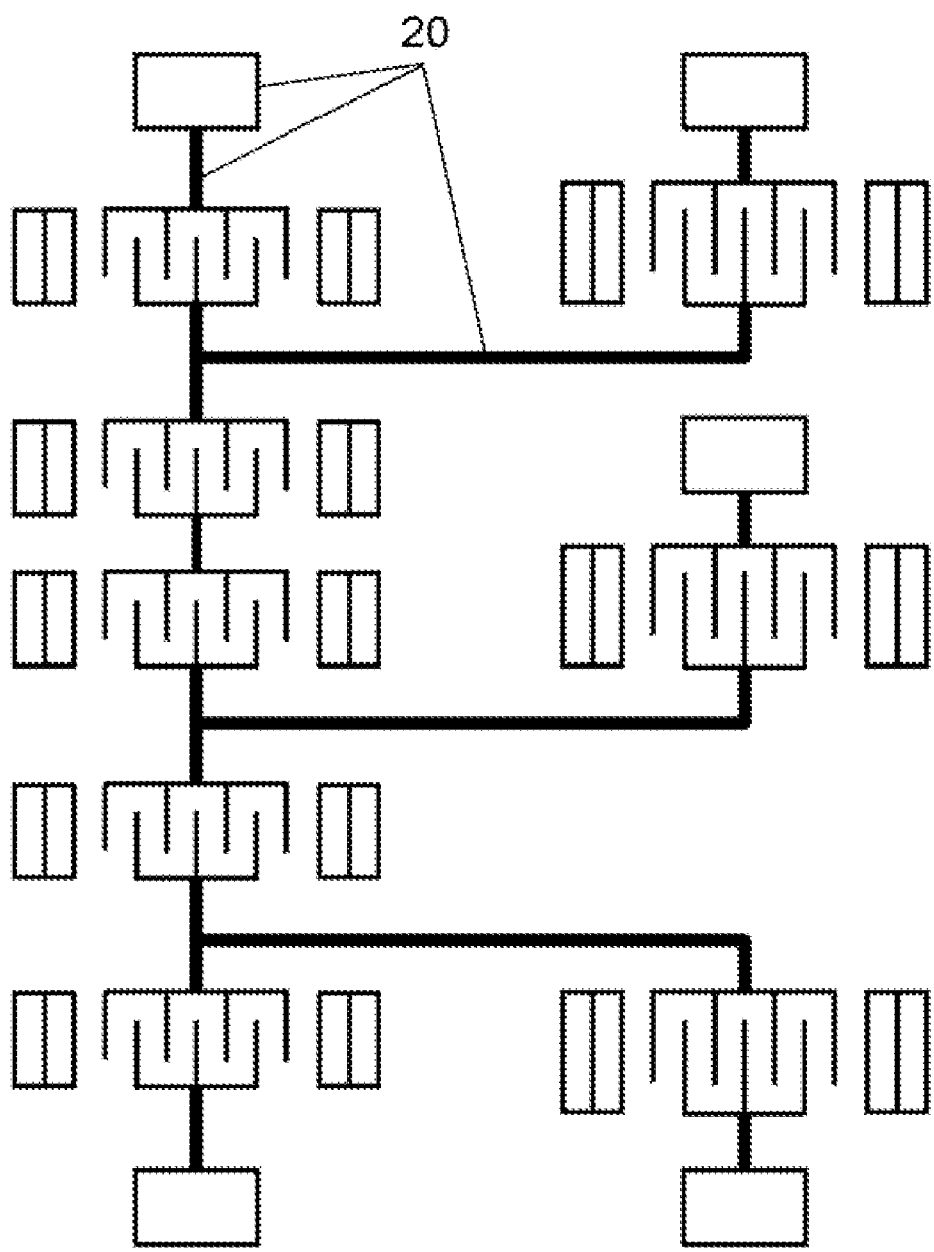
FIG. 6 shows a ladder-type filter.

FIG. 3A shows transmission characteristics of a band-pass filter using SAW filter 1. FIG. 6 shows a ladder-type filter. The band-pass filter is a kind of ladder-type filter as shown in FIG. 6, and is formed of a plurality of SAW filters 1. FIG. 3B is an enlarged view of an area "T" enclosed by a dotted line shown in FIG. 3A, the area "T" including the point of 880 MHz. As known from FIG. 3B, the propagation loss in the pass band of SAW filter 1 is reduced when the thickness M of signal wiring 5 is not less than about 2.4 μm.

Setting the thickness M of signal wiring 5 to not less than a predetermined value allows signal wiring 5 to have low propagation loss, so that SAW filter 1 including signal wiring 5 has excellent transmission characteristics.

It has turned out that the thickness M of signal wiring 5 that provides low propagation loss is associated with the skin depth of signal wiring 5. When a high frequency signal is passing through signal wiring 5, the current concentrates on the surface of signal wiring 5, and the electric current density decreases exponentially with increasing depth from the surface. The term "skin depth" means the depth from the surface at which the electric current density is 1/e (about 0.37) of its value at the surface. Most of the current is concentrated in the region at this depth. The skin depth "d" (µm) is calculated by Formula 1:

$$d = \sqrt{\frac{2.0 \times 10^{-4}}{f \times \sigma}}$$ Formula 1 where "f" represents the frequency (GHz) of a signal passing through signal wiring 5, and "σ" represents the electrical conductivity (S/m) of signal wiring 5.

Figure 4:
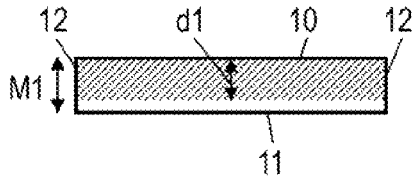
FIG. 4 shows the relation between the thickness and skin depth of signal wiring of the SAW filter according to the first embodiment.

FIG. 4 shows the relation between the thickness M of signal wiring 5 that provides low propagation loss and the skin depth "d" of signal wiring 5. Drawings (a) to (d) in FIG. 4 each show only the skin depth from upper surface 10 of signal wiring 5, and does not show the skin depth from lower surface 11 or side surface 12. Although the drawings (a) to (d) do not show the distribution of the electric current density, the electric current density actually decreases exponentially with increasing depth from the surface.

In the drawing (a), signal wiring 5 has a thickness M1, and the highest frequency signal in the pass band of SAW filter 1 has a skin depth "d1". In the drawing (b), signal wiring 5 has the thickness M1, and the lowest frequency signal in the pass band of SAW filter 1 has a skin depth "d2". In the drawing (c), signal wiring 5 has a thickness M2 larger than the thickness M1, and the high frequency signal has the skin depth "d1". In the drawing (d), signal wiring 5 has the thickness M2, and the lowest frequency signal has the skin depth "d2".

The highest frequency signal in the transmission frequency range of UMTS Band VIII is 915 MHz. When signal wiring 5 is made of Al (electrical conductivity "σ") and has the thickness M1, the skin depth "d1" is 2.34 µm. As shown in the drawing (a) in FIG. 4, the thickness M1 is larger than the skin depth "d1", so that most of the current propagates with no loss.

The lowest frequency signal in the transmission frequency range of UMTS Band VIII is 880 MHz. When signal wiring 5 is made of Al (electrical conductivity "σ") and has the thickness M1, the skin depth "d2" is 2.38 µm. As shown in the drawing (b) in FIG. 4, the thickness M1 is smaller than the skin depth "d2", so that the current is not transmitted efficiently, causing propagation loss.

On the other hand, when signal wiring 5 is made of Al (electrical conductivity "σ") and has the thickness M2, most of the current propagates because the thickness M2 is larger than the skin depth "d2" on the low frequency side as shown in the drawings (c) and (d) in FIG. 4.

The relation between the thickness M and the skin depth from lower surface 11 is the same as the relation between the thickness M and the skin depth from upper surface 10. Signal wiring 5 generally has a line width larger than the skin depth, so that the current flowing in the skin depth from side surface 12 propagates with no loss.

As described hereinbefore, by making the thickness M of signal wiring 5 larger than the skin depth "d2" on the low frequency side of the pass band of SAW filter 1, signal wiring 5 has low propagation loss, so that SAW filter 1 has low propagation loss in its pass band.

In the case where the outer edge of IDT electrode 3 is extended between piezoelectric body 2 and signal wiring 5, the thickness M can be the total thickness of IDT electrode 3 and signal wiring 5.

Figure 5:
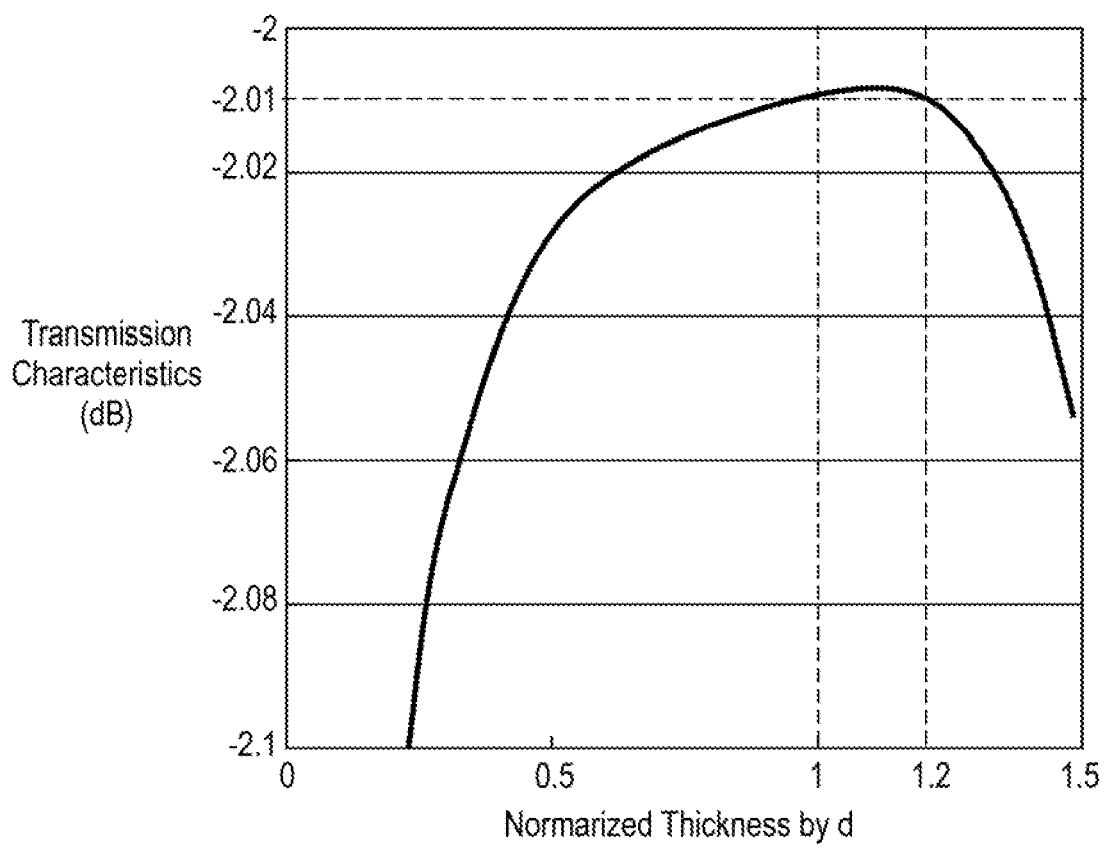
FIG. 5 shows the actual Measurement data of the transmission characteristics of the SAW filter according to the first embodiment at 880 MHz.

FIG. 5 shows the actual measurement data of the transmission characteristics of SAW filter 1 at 880 MHz. More specifically, the actual measurement data shows the propagation loss in the case where signal wiring 5 has the thickness M and a signal passing through signal wiring 5 has a frequency of 880 MHz. As shown in FIG. 5, the propagation loss gradually decreases until the thickness M reaches 1.1 d, but begins to increase after that. This is because in the case where signal wiring 5 is formed into a thin film, its surface becomes rougher as the thickness M increases. The thin film formation process of signal wiring 5, which follows the formation of IDT electrode 3, generally uses vacuum evaporation. Since the conductive material used for signal wiring 5 has been evaporated and deposited, signal wiring 5 has asperities on its surface. When the thickness M increases, the amount of deposition also increases, thereby inevitably increasing the asperities on the surface. Thus, the larger the thickness M, the larger the surface roughness of signal wiring 5. A larger surface roughness increases the loss due to the resistance of the current flowing around the surface of signal wiring 5, thereby increasing the propagation loss of signal wiring 5.

Thus, too large a thickness M of signal wiring 5 increases the propagation loss. Therefore, it is preferable that the thickness M is set to the lower limit of the optimum thickness specified by the skin depth "d" of signal wiring 5. The lower limit is 1.0 time the skin depth "d". However, considering that the thickness M has a variation of about 10% due to process variations, it is preferable to design the thickness M to be 1.1 times the skin depth "d". As a result, the thickness M of signal wiring 5 is in the range of 1.0 to 1.2 times the skin depth "d" (1.1d±10%). Thus, the lower limit of the thickness M of signal wiring 5 is in the range of 1.0 to 1.2 times the skin depth "d", thereby providing high reliability.

As described above, when the thickness M is in the range of 1.0 to 1.2 times the skin depth "d", signal wiring 5 has low propagation loss. Thus, the thickness M can maximize the effect of the skin depth "d" on a reduction in the propagation loss, and minimize the effect of the surface roughness on an increase in the propagation loss. As a result, SAW filter 1 has excellent transmission characteristics.

Figure 7:
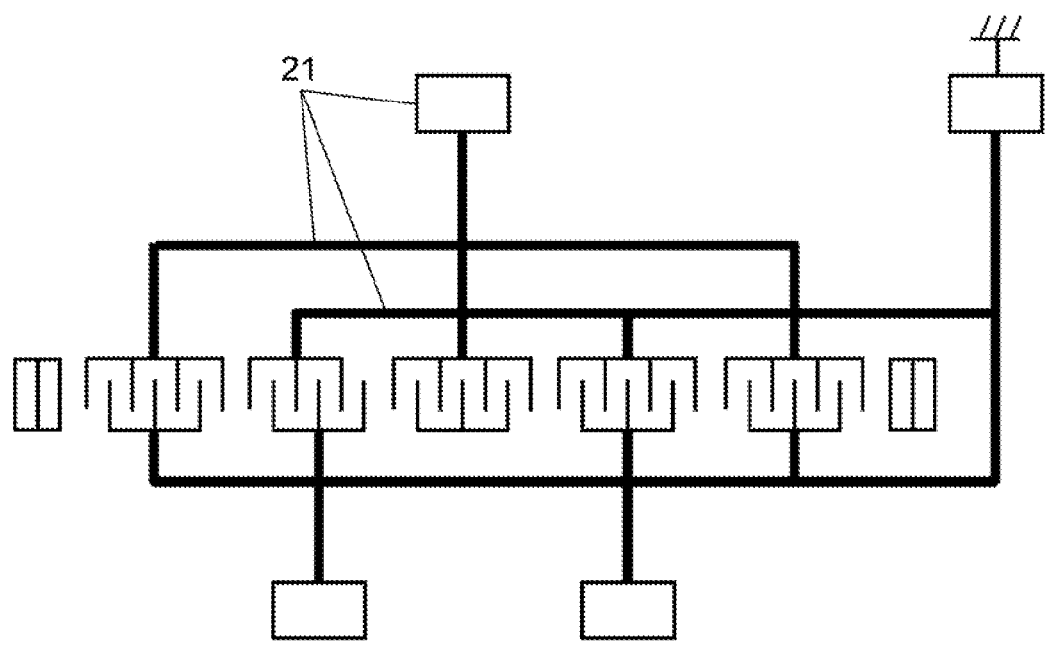
FIG. 7 shows a longitudinally-coupled double-mode filter.

The effects of the present invention described in the present embodiment are not limited to a SAW filter having one IDT electrode. FIG. 6 shows a ladder-type filter, and FIG. 7 shows a longitudinally-coupled double-mode filter. The effects can also be applied to a ladder-type filter as shown in FIG. 6 or to a longitudinally-coupled double-mode filter as shown in FIG. 7. The ladder-type filter has a plurality of IDT electrodes connected in a ladder form, and the longitudinally-coupled double-mode filter has a plurality of IDT electrodes between a pair of reflectors. These filters of FIGS. 6 and 7 include signal wiring 20 and signal wiring 21, respectively, which have a thickness not less than the skin depth "d" so as to have low propagation loss. Signal wiring 20 in FIG. 6 and signal wiring 21 in FIG. 7 can have a thickness M where $1.0 \times d \leq M \leq 1.2 \times d$, allowing the propagation loss to be low in consideration of the effect of the surface roughness on an increase in the propagation loss.

Alternatively, the signal wiring can include an electrode pad or ground wiring as shown in FIGS. 6 and 7.

Figure 8:
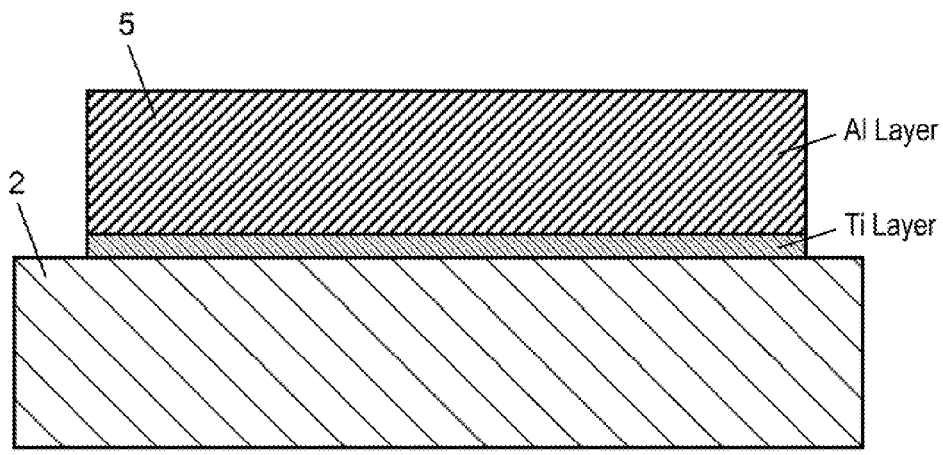
FIG. 8 is a sectional view of another example of the SAW filter according to the first embodiment.

Signal wiring 5 may have a laminated structure of a plurality of electrode layers. When the skin depth "d" is not larger than the thickness of the uppermost electrode layer of signal wiring 5, the electrical conductivity "σ" of signal wiring 5 is equal to the electrical conductivity of the uppermost electrode layer. Assume that signal wiring 5 is used in duplexer 30 designed for UMTS Band VIII with transmit frequency range (880 to 915 MHz) and receive frequency range (925 to 960 MHz), and that a signal passing through signal wiring 5 has a frequency "f" of 0.92 GHz. In FIG. 8, which is a sectional view of another example of SAW filter 1, when signal wiring 5 is formed of a 2.4 µm thick Al layer ($\sigma=40.0\times10^6$ (S/m)) as the uppermost layer, and a 0.1 µm thick Ti layer ($\sigma=2.340\times10^6$ (S/m)) thereunder, the skin depth "d" is 2.33 µm. In this case, the electrical conductivity of the uppermost Al layer becomes the electrical conductivity "σ" of signal wiring 5, which is a factor to determine the skin depth "d.

Figure 9:
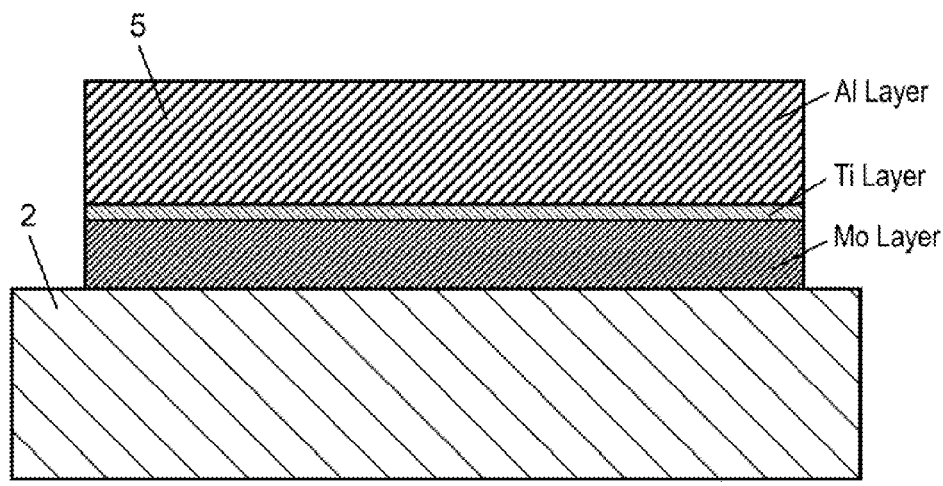
FIG. 9 is a sectional view of further another example of the SAW filter according to the first embodiment.

In contrast, when the skin depth "d" is larger than the thickness of the uppermost electrode layer, the electrical conductivity "σ" of signal wiring 5 is equal to the average electrical conductivity of all electrode layers within the skin depth "d" from the upper surface of signal wiring 5. Similarly, assume that in duplexer 30, a signal passing through signal wiring 5 has a frequency "f" of 0.92 GHz. In FIG. 9, which is a sectional view of further another example of SAW filter 1, when signal wiring 5 is formed of a 1.8 µm thick Al layer ($\sigma=40.0\times10^6$ (S/m)) as the uppermost layer, a 0.1 µm thick Ti layer ($\sigma=2.340\times10^6$ (S/m)) thereunder, and a 1.0 µm thick Mo layer thereunder, the skin depth "d" is 2.65 µm. In this case, the average electrical conductivity of each of the Al, Ti, and Mo electrode layers (within the skin depth "d" from the upper surface of signal wiring 5) becomes the electrical conductivity "a" of signal wiring 5, which is a factor to determine the skin depth "d". The electrical conductivity of each of the Al, Ti, and Mo electrode layers covers only the upper 0.75 µm region of each electrode layer.

Thus, in the case where signal wiring 5 has a laminated structure of a plurality of electrode layers, the thickness M of signal wiring 5 can be not less than 1.0 d, and more preferably, in the range of 1.0 to 1.2 d, thereby having low propagation loss.

Second Embodiment

Figure 10:
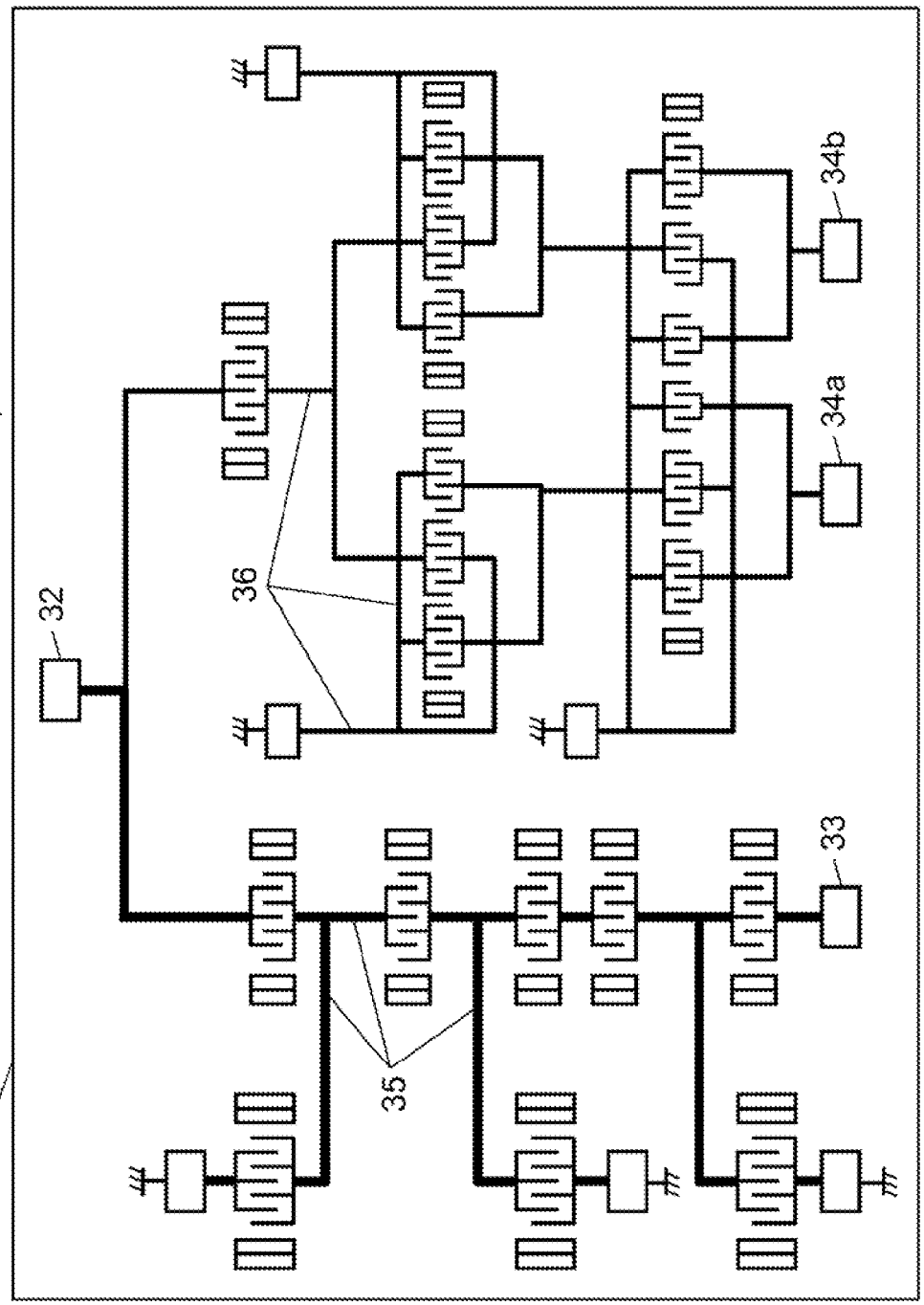
FIG. 10 is a plan view of a duplexer according to a second embodiment of the present invention.

Duplexer 30 according to a second embodiment of the present invention will be described as follows with reference to FIG. 10: FIG. 10 is a plan view of duplexer 30. Duplexer 30 has an IDT electrode, which has the same structure as the one used in the first embodiment, and therefore, the IDT electrode will not be described again in this embodiment.

Duplexer 30 includes a transmit filter and a receive filter. The transmit filter includes piezoelectric body 31, antenna terminal 32 and transmission signal input terminal 33, which are formed on piezoelectric body 31, and transmitting signal wiring 35, which connect between terminals 32 and 33. The receive filter includes antenna terminal 32, two reception signal output terminals 34a and 34b, and receiving signal wiring 36, which connects between terminal 32 and terminals 34a, 34b. The transmit filter is formed of a plurality of IDT electrodes connected in a ladder form. The receive filter is formed of a single IDT electrode and three longitudinally-coupled double-mode filters. These IDT electrodes have the same structure as the IDT electrode used in the first embodiment.

The IDT electrodes and the longitudinally-coupled double-mode filters are schematically illustrated in FIG. 10; in reality, however, the number of the IDT electrodes and the ratio between the intersection widths may be different.

Each of transmitting and receiving signal wirings 35 and 36 is mainly composed of Al and has a laminated structure of an Al layer and a Ti layer. Transmitting and receiving signal wirings 35 and 36 each have a thickness M of 2.4 µm.

Duplexer 30 is designed for UMTS Band VIII, and the center frequency between the transmit frequency range 880 to 915 MHz and the receive frequency range 925 to 960 MHz is 920 MHz. At 920 MHz, the skin depth "d" of the Al layer calculated by Formula 1 is 2.33 µm. Therefore, the thickness M of each of transmitting and receiving signal wirings 35 and 36 is set to 2.4 µm, which is the intermediate value between 2.33 µm which is the skin depth and 2.79 µm, which is 1.2 times of the skin depth. This thickness M allows transmitting and receiving signal wirings 35 and 36 to be formed by the same process. In addition, as shown in FIG. 5, the thickness M can maximize the effect of the skin depth "d" on a reduction in the propagation loss, and minimize the effect of the surface roughness on an increase in the propagation loss for the signals to be transmitted and received.

The thickness M is not necessarily the same between transmitting and receiving signal wirings 35 and 36. For example, it is possible that transmitting and receiving signal wirings 35 and 36 have a thickness Mt and Mr, respectively, and that the thicknesses Mt and Mr are in the range of 1.0 to 1.2 times the skin depth in the frequency range of the respective signals. In this case, the thickness Mr of receiving signal wiring 36 is larger than the thickness Mt of transmitting signal wiring 35. This is because the receive frequency range includes higher frequencies than the transmit frequency range of UMTS Band VIII.

Thus, the thicknesses Mt and Mr of transmitting and receiving signal wirings 35 and 36 are made to be suitable to the frequencies of the signals passing through them, making low propagation loss. In this case, the transmit and receive filters may be formed on different piezoelectric bodies from each other.

What is claimed is:
1. A surface acoustic wave filter comprising:
a piezoelectric body;
an IDT electrode on the piezoelectric body; and
signal wiring electrically connected to the IDT electrode,
wherein the IDT electrode and the signal wiring overlap each other at respective outer edges, and
in the outer edges where the IDT electrode and the signal wiring overlap each other, the IDT electrode and the signal wiring have a total thickness not less than a skin depth "d" (µm), the skin depth "d" being calculated by Formula 1:

$$d = \sqrt{\frac{2.0 \times 10^{-4}}{f \times \sigma}} \qquad \text{Formula 1}$$

where "f" represents a frequency (GHz) of a signal passing through the signal wiring, and "σ" represents an electrical conductivity (S/m) of the signal wiring, and
wherein the total thickness is in a range of 1.0 to 1.2 times the skin depth "d".
2. The surface acoustic wave filter of claim 1, wherein
the signal wiring has a laminated structure of a plurality of electrode layers, and
in a case where the skin depth "d" is not larger than a thickness of an uppermost electrode layer of the signal wiring, the electrical conductivity "σ" of the signal wiring is equal to an electrical conductivity of the uppermost electrode layer.

3. The surface acoustic wave filter of claim 1, wherein
the signal wiring has a laminated structure of a plurality of electrode layers, and
in a case where the skin depth "d" is not larger than a thickness of an uppermost electrode layer of the signal wiring, the electrical conductivity "σ" of the signal wiring is equal to an electrical conductivity of the uppermost electrode layer.

4. A duplexer comprising:
a receive filter including a surface acoustic wave filter; and
a transmit filter including a surface acoustic wave filter,
wherein the surface acoustic wave filter of the receive filter has signal wiring larger in thickness than signal wiring of the surface acoustic wave filter of the transmit filter,
wherein each surface acoustic wave filter comprises:
a piezoelectric body;
an IDT electrode on the piezoelectric body; and
signal wiring electrically connected to the IDT electrode, and
wherein the signal wiring has a thickness not less than a skin depth "d" (μm), the skin depth "d" being calculated by Formula 1:

$$d = \sqrt{\frac{2.0 \times 10^{-4}}{f \times \sigma}} \quad \text{Formula 1}$$

where "f" represents a frequency (GHz) of a signal passing through the signal wiring, and "σ" represents an electrical conductivity (S/m) of the signal wiring.

5. A surface acoustic wave filter comprising:
a piezoelectric body;
an IDT electrode on the piezoelectric body; and
signal wiring electrically connected to the IDT electrode,
wherein the signal wiring has a thickness not less than a skin depth "d" (the skin dept "d" being calculated by Formula 1:

$$d = \sqrt{\frac{2.0 \times 10^{-4}}{f \times \sigma}} \quad \text{Formula 1}$$

where "f" represents a frequency (GHz) of a signal passing through the signal wiring, and "σ" represents an electrical conductivity (S/m) of the signal wiring, and
wherein the signal wiring has a laminated structure of a plurality of electrode layers, and
in a case where the skin depth "d" is larger than a thickness of an uppermost electrode layer of the signal wiring, the electrical conductivity "σ" of the signal wiring is equal to an average electrical conductivity of all electrode layers within the skin depth "d" from an upper surface of the signal wiring.

6. A surface acoustic wave filter comprising:
a piezoelectric body;
an IDT electrode on the piezoelectric body; and
signal wiring electrically connected to the IDT electrode,
wherein the IDT electrode and the signal wiring overlap each other at respective outer edges, and
in the outer edges where the IDT electrode and the signal wiring overlap each other, the IDT electrode and the signal wiring have a total thickness not less than a skin depth "d" (μm), the skin depth "d" being calculated by Formula 1:

$$d = \sqrt{\frac{2.0 \times 10^{-4}}{f \times \sigma}} \quad \text{Formula 1}$$

where "f" resents a frequency (GHz) of a signal passing through the signal wiring, and "σ" represents an electrical conductivity (S/m) of the signal wiring, and
wherein the signal wiring has a laminated structure of a plurality of electrode layers, and
in a case where the skin depth "d" is larger than a thickness of an uppermost electrode layer of the signal wiring, the electrical conductivity "σ" of the signal wiring is equal to an average electrical conductivity of all electrode layers within the skin depth "d" from an upper surface of the signal wiring.

* * * * *